US005798536A

United States Patent [19]
Tsutsui

[11] Patent Number: 5,798,536
[45] Date of Patent: Aug. 25, 1998

[54] LIGHT-EMITTING SEMICONDUCTOR DEVICE AND METHOD FOR MANUFACTURING THE SAME

[75] Inventor: Tsuyoshi Tsutsui, Kyoto, Japan

[73] Assignee: Rohm Co., Ltd., Kyoto, Japan

[21] Appl. No.: 785,037

[22] Filed: Jan. 17, 1997

[30] Foreign Application Priority Data

| Jan. 25, 1996 | [JP] | Japan | 8-011224 |
| Mar. 25, 1996 | [JP] | Japan | 8-068572 |
| Apr. 30, 1996 | [JP] | Japan | 8-109196 |
| May 23, 1996 | [JP] | Japan | 8-128764 |

[51] Int. Cl.$^6$ .................................................. H01L 33/00
[52] U.S. Cl. .................................................. 257/99; 257/98
[58] Field of Search .................................................. 257/99, 98

[56] References Cited

U.S. PATENT DOCUMENTS 3,964,157  6/1976  Kuhn et al. .
5,293,066  3/1994  Tsumura .

FOREIGN PATENT DOCUMENTS 63-226979  9/1988  Japan .
2-39578  2/1990  Japan .

*Primary Examiner*—Stephen Meier
*Attorney, Agent, or Firm*—Nikaido, Marmelstein, Murray & Oram LLP

[57] ABSTRACT

Desclosed is a light-emitting semiconductor device has a light-emitting chip. The light-emitting chip has an insulator substrate and a semiconductor layer formed overlying the substrate. First and second conductivity type regions are formed in the semiconductor layer. The second conductivity type region has an exposed surface formed by removing part of the semiconductor layer. A top electrode is formed on a surface of the first conductivity type region. An end electrode is formed on an exposed surface of the second conductivity type region. A first electrode lead is mounted with the light-emitting chip and has a projecting portion extending along an adjacent surface of the light-emitting chip. A second electrode lead extends parallel to the first electrode lead. A conductor wire is electrically connected between the second electrode lead and the top electrode. The end electrode and the projecting portion are electrically connected through an electrically-conductive resin.

7 Claims, 4 Drawing Sheets

LIGHT-EMITTING SEMICONDUCTOR DEVICE AND METHOD FOR MANUFACTURING THE SAME

BACKGROUND OF THE INVENTION

1. Field of the Invention

This invention relates to light-emitting semiconductor devices formed with the use of an insulator substrate, and more particularly to a structure of such devices wherein improvement is made for enhancing the reliability in electrical connection between a light-emitting chip and electrode leads for electrical current supply.

2. Background Art

There are broad utilization of light emitting diodes in various technical fields of such as indicators, displays, and sensors, because they are usable as a highly responsive and reliable light-emitting source with relatively low electric power consumption. In particular, attentions are recently being drawn to light-emitting chips formed base on gallium nitride (GaN) which is capable of emitting a short wavelength portions of light, i.e., blue-color light or blue-green light.

In GaN-based light-emitting chips, since there are difficulties in growing a GaN-base semiconductor layer on a conventional wafer of GaAs, GaP, or the like, it is usually formed in plurality of layers on an insulator substrate such as sapphire wafer. The semiconductor layer formed on the sapphire substrate ordinarily includes an active layer for creation of optical waves and upper and lower clad layers sandwiching the active layer for confining carriers.

In this manner, GaN semiconductor layer is formed over an insulator sapphire substrate in a light emitting-chip, electrodes thereof are usually provided respectively on the surface of a lower clad layer and the top surface of an upper clad layer. To assemble the light-emitting semiconductor device of this kind, electrical connection is implemented as shown in FIG. 7(a), wherein wire-bonding is done by the utilization of Au wires 27, 28 respectively between the chip electrode 22, 23 and parallel-extending electrode leads 26, 25. A base portion 24 is provided at the top of one electrode lead 25 for mounting the light-emitting chip.

Meanwhile, there has been proposed a light-emitting semiconductor device structure wherein no wire-bonding is done, as shown in FIG. 7(b). In this structure, there are provided two base portions 27a, 28a formed respectively at the tops of the electrode leads 27, 28 so that a light-emitting chip 29 is mounted on the electrode lead 27. In this structure, chip electrodes 30, 31 are respectively in abutment against the base portions 27a, 28a.

However, in the conventional light-emitting semiconductor device of FIG. 7(a), there is necessity of implementing wire-bonding for respective both Au wires 27, 28 for one chip 21. With such structure, there necessarily involves a certain rate of wire-bonding failures leading to one major factor of lowering the yield of device manufacture.

In the structure of FIG. 7(b), on the other hand, the chip electrodes 27, 28 are directly connected by abutment onto the respective base portions 27a, 28a of the electrode leads 30, 31. The light-emitting chip 29 is placed bridging between the electrode leads 27, 28 via the connection points, i.e., the electrode 30 and base portion 27a, and the electrode 31 and the base portion 28a. With such structure, however, the light-emitting chip 29 is liable to directly experience external force through the electrode leads 27, 28. To this end, it seems rather difficult for this structure to be placed into practical use. This is because GaN light-emitting chips in general are less resistive to externally applied stresses, and if applied with such stresses, the chip will have serious damages upon electrical and optical properties.

In the conventional structures, there involved are further disadvantages. That is, semiconductor device of FIG. 7(b) radiates light from the light-emitting region of the semiconductor layer through the sapphire substrate in the backside of the chip. In this structure, no efficient reflection is available for the light emitted toward the chip substrate back to the front of the device.

This is true for the structure of FIG. 7(a). Although the sapphire substrate is optically transparent, Ag-particle contained conductive resin paste for example is utilized to connect between the chip 21 and the base portion 24. The connection with the particulate Ag paste will considerably absorb light, resulting in low optical reflectivity.

In order to enhance the reflectivity, there is a technique of adding white-color filler of aluminum or titanium oxide. With such methods, however, it is impossible to eliminate light absorption by the adhesive, and sufficient light-radiation efficiency is not yet available. Besides, there is a technique of providing a light-reflection film, e.g., on a light-emitting chip pad so that a light-emitting chip is mounted on the reflecting film through a transparent adhesive. However, absorption of reflecting light by the transparent adhesive is unavoidable even with this structure. Furthermore, in such cases the reflecting film must not be provided in a surface area where conductive wire is wire-bonded, and die-bonding a chip must be made in a limited surface area. If variation or deviation in position is incurred during the bonding process, optical quality such as brightness characteristic results in variation.

SUMMARY OF THE INVENTION

It is an object of the present invention to provide a light-emitting semiconductor device in which improvement is made on connection structure for an electrode on a light-emitting chip, thereby providing high reliability through raised yield of manufacture.

It is another object of the present invention to raise the external efficiency of light radiation by improving the reflectivity of the light emitted from a semiconductor layer of a light-emitting chip toward a substrate in a backside thereof.

It is a further object of the present invention to provide a method of manufacturing a light-emitting semiconductor device wherein improvement is made for the connecting structure of an electrode on a light-emitting chip, thereby simplifying the assembling process.

In accordance with a first aspect of the present invention, there is provided a light-emitting semiconductor device comprising: a light-emitting chip having an insulator substrate and a semiconductor layer formed overlying the substrate; first and second conductivity type regions formed in the semiconductor layer, the second conductivity type region having an exposed surface formed by removing part of the semiconductor layer; a top electrode formed on a surface of the first conductivity type region; and an end electrode formed on an exposed surface of the second conductivity type region;

a first electrode lead mounted with the light-emitting chip and having a projecting portion extending along an adjacent surface of the light-emitting chip;

a second electrode lead extending near the first electrode lead.;

a conductor wire electrically connected between the second electrode lead and the top electrode; and wherein the end electrode and the projecting portion are electrically connected through an electrically-conductive resin.

With such structure, implementation of electrical connection with using a conductor wire is limited to one of the chip electrodes because the other electrode is directly connected through conductive resin to the projecting portion integral with the chip-mounting base portion. Consequently, even if force be applied through an electrode lead, the light-emitting chip is almost free from stresses. An Ag-particle contained paste resin, for example, may be used as the conductive paste resin. As t he light-emitting semiconductor chip applicable is an LED having an optically-transparent sapphire substrate and gallium-nitride (GaN) based semiconductor formed over the substrate. Note that the gallium-nitride based semiconductor is formed by a III-V compound semiconductor comprising group-III Ga and group-V N wherein part of Ga may be replaced by other group-III elements such as Al and In and/or part of N may be replaced by other group-V elements such as P and As.

Preferably, the projecting portion of the first electrode lead is formed such that a top face thereof is substantially in flush with that of the end electrode of the light-emitting chip. With such structure, electrical connection is performed between the chip end electrode and the projecting portion in flush therewith by merely dripping electrically-conductive resin from the above. Note that substantially in flush means that a step given is sufficiently small to an extent that the resin dripped is not separated.

The projecting portion of the first electrode lead may be formed such that a top face thereof is higher than that of the end electrode of the light-emitting chip so that electrical connection is done between the end electrode and a lateral surface of the projecting portion.

Further preferably, the substrate of the light-emitting chip is formed of a material for transmission of light emitted from the semiconductor layer and the light-emitting chip has a light-reflecting film formed on a surface being mounted to the first electrode lead. By doing so, the light traveling toward the backside of the substrate can be effectively reflected back to the front of the device, thereby enhancing light-radiation efficiency. The light-reflecting film may be a metal film, a metal oxide film or a ceramics film formed on a backside of the substrate.

In accordance with a second aspect of the present invention, there is provided a light-emitting semiconductor device comprising: a light-emitting chip having an insulator substrate and a semiconductor layer formed overlaying the substrate; a first electrode lead mounted with the light-emitting chip and electrically connected via a conductor wire to the light-emitting chip; and wherein the substrate is formed of a material for transmission of light emitted from the semiconductor layer and the light-emitting chip has a light-reflecting film formed on a surface being mounted to the first electrode lead. With such structure, the light emitted from the semiconductor layer toward the backside of the substrate is reflected back to the front of the device to be radiated through a front face of the light-emitting chip, enhancing light-radiation efficiency.

In accordance with a third aspect of the present invention, there is provided a method of manufacturing a light-emitting semiconductor device comprising the steps of: (a) forming a light-emitting chip having a semiconductor layer, the semiconductor layer having first and second conductivity type regions and a light-emitting region sandwiched between the first and second conductivity regions, wherein a top electrode is provided on the first conductivity type region and an end electrode is provided on an exposed surface formed by removing part of the semiconductor layer; (b) forming first and second electrode leads such that the first electrode lead has a base portion for mounting with the light-emitting chip and a projecting portion extending along the light-emitting chip to have a top surface in flush with that of the end electrode of the light-emitting chip; (c) die-bonding the light-emitting chip onto the base portion of the first electrode lead through an adhesive; (d) electrically connecting between the second electrode lead and the top electrode of the light-emitting chip with using a conductor wire; and (e) applying an electrically-conductive resin to between the end electrode of the light-emitting chip and the projecting portion of the first electrode lead to provide electrical connection by curing the conductive resin. With such method, where the projecting portion has a top surface substantially in flush with a top face of the end electrode of the light-emitting chip, conductive resin may be dripped onto between them. Where the projecting portion has a top surface higher than a top face of the end electrode of the light-emitting chip, conductive resin may be dripped onto between them with the first electrode lead inclined. Thus, electrical connection can be easily performed.

For a fuller understanding of the nature and advantages of the invention, reference should be made to the ensuing detailed description taken in conjunction with the accompanying drawings.

PREFERRED EMBODIMENT OF THE INVENTION

Figure 1:
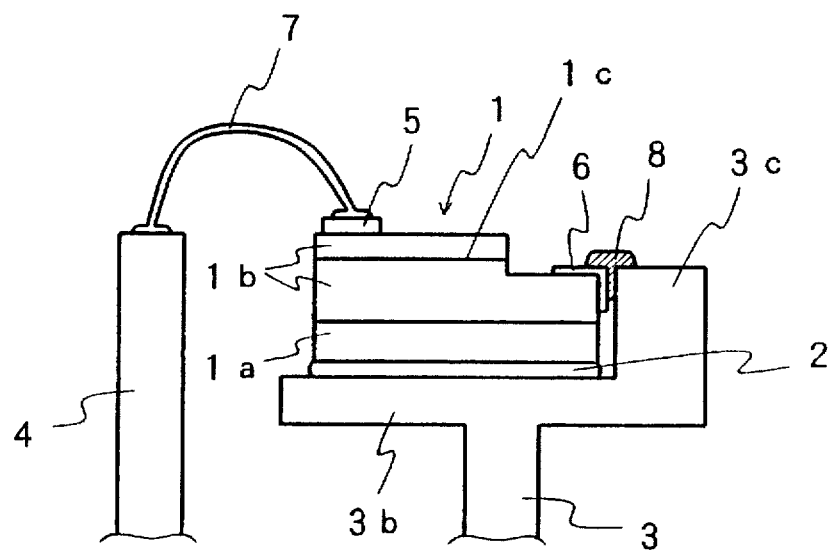
FIG. 1 is a side view of a light-emitting semiconductor device, showing an essential part thereof, according to first embodiment of the present invention.

Referring first to FIG. 1, there is illustrated a cross-sectional view showing an essential part of an light-emitting semiconductor device according to one embodiment of the present invention.

The light-emitting semiconductor device comprises a light-emitting chip 1 based on gallium nitride (GaN), a first electrode lead 3 having a planer surface for mounting thereon the light-emitting chip 1 through an adhesive 2, and a second lead 4 which is of the same material as the first electrode lead and extending in parallel therewith.

The light-emitting chip 1 includes a sapphire substrate 1a as an electrical insulator, and a semiconductor layer 1b formed over the sapphire substrate 1a. The semiconductor layer 1b further comprises an upper p-type layer and an lower n-type layer. A top electrode 5 as a metal pad is formed on the surface of the p-type region of the semiconductor layer 1b, whereas an end electrode 6 is provided at a stepped position in the n-type region on the opposite side to the top electrode 5. The light-emitting chip is generally of a rectangular parallelepiped with the end region thereof formed stepped. A light-emitting region 1c as an active layer is formed between the p-type and n-type semiconductor layers so that light is radiated from the light-emitting region 1c when an electric current is supplied through the respective electrodes 5 and 6.

The first electrode lead 3 is formed of an electrically conductive material to have a projecting portion 3c which extends in parallel with the opposed side face of the light-emitting chip. That is, the projecting portion 3c of the first electrode lead 3 takes a rectangular parallelepiped form to extend along the opposite side face of the light-emitting chip 1 of the general rectangular parallelepiped. The end electrode 6 of the light-emitting chip 1 is provided such that a top surface thereof is substantially in flush with that of the projecting portion 3c. Between the projecting portion 3c and the end electrode 6 of the light-emitting chip 1, electrical connection is made directly by the use of an electrically conductive material 8.

The light-emitting semiconductor device as thus constructed is fabricated in a manner described hereinbelow. That is, first prepared are a leadframe provided with first and second electrode lead, not shown, together with light-emitting chips formed of gallium-nitride based compound semiconductor which is to be mounted on the first electrode lead of the leadframe. The first electrode lead electrode 3, as shown in a top view of FIG. 2, has a base portion 3b having a planar surface 3a for mounting thereon a light-emitting chip 1, and a projecting portion 3c in the rectangular parallelepiped form extending from one end of the base 3b, as stated hereinbefore. The planar surface 3a is mirror finished so as to provide proper optical reflectivity.

After preparing a leadframe and the light-emitting chips, the light-emitting chip 1 at its backside, i.e., the backside of the sapphire substrate 1a, is mounted on the planar surface 3a of the first electrode lead 3 through the use of an adhesive 2. The adhesive 2 may for example be an epoxy-based ultraviolet(UV) ray-setting resin or thermo-setting resin. If the adhesive 2 is optically transparent, light reflection is available therethrough, as will be stated later.

Figure 2:
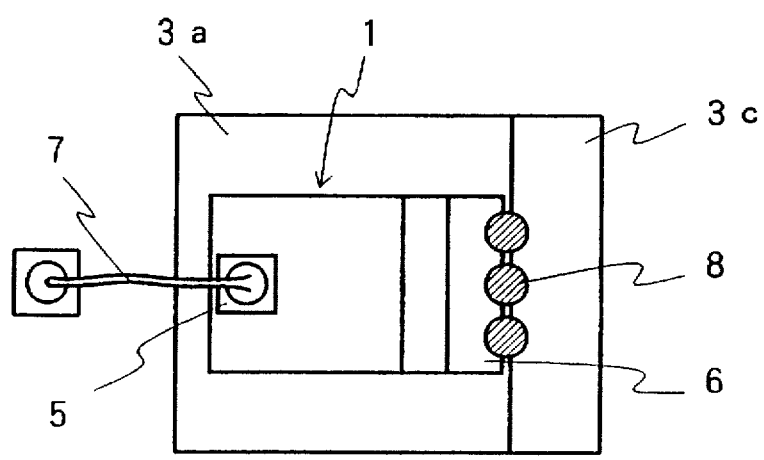
FIG. 2 is a top plan view of the light-emitting semiconductor device of FIG. 1.

After mounting the light-emitting chip 1 on the leadframe, electrical connection is carried out respectively between the end electrode 5 and the first electrode lead 3 as well as the top electrode 5 and the second electrode lead 4. In the present invention, the top electrode 5 is subjected to connection by using an Au wire 7 to the second electrode lead 4, as shown in FIGS. 1 and 2. The end electrode 6, on the other hand, is connected through the use of an electrically conductive material 8 to the projecting portion 3c of the first electrode lead 3. The conductive material 8 may be a pasty resin containing conductive particles such as Ag. The electrical connection by the conductive material is performed by dripping from the above onto between the end electrode 6 and the projecting portion 3c with the electrode 6 and the projecting portion 3c placed closed to or contacted with each other, as shown in FIG. 2. If the top electrode 6 is provided such that a top surface thereof is substantially in flush with that of the projecting portion 3c, dripping of the conductive material is easy to perform. In such cases, it is preferred to perform dripping the conductive material to a plurality of sites, to raise reliability of electrical connection. If adjustment is properly made as to a gap given between the end electrode pad 6 and the projecting portion 3c and/or the viscosity of the pasty resin, electrical connection will be further assured by introducing the resin into the gap besides between the top surfaces thereof.

In the light-emitting semiconductor device thus constructed, when electric current is supplied through the first and second electrode leads 3, 4, light is created by the electric current supplied through the light-emitting portion 1c and radiated toward the outside of the light-emitting chip 1. On this occasion, part of the light travels toward the planar surface 3a of the first electrode lead 3. Some portion of such light goes outside the light-emitting chip 1 and reflected by the mirror surface 3a, whereas the other portion travels through the inside of the light-emitting chip 1 and the transparent adhesive 2, and then reflected by the mirror surface 3a. In ordinary cases, it is difficult to enhance the brightness of light emitted from a semiconductor device to a certain extent or higher. However, the light-emitting semiconductor device of the present invention is capable of suppressing losses in brightness of light to a minimum, enhancing the efficiency of light radiation.

Furthermore, the application of the conductive material 8 to a connecting point can be limited to a narrow area of the end electrode 6 and the projecting portion 3c of the first electrode lead 3. As a consequence, there is no fear of spreading of the dripped adhesive resin beyond the edge of the end electrode 6 to the surface of the light-emitting chip 1 so that there is almost no possibility of shielding light radiation on the front side of the light-emitting chip or device. Furthermore, the implementation of wire bonding is limited only to the top electrode 5 side, because the end electrode 6 is through the conductive material 8. This arrangement contributes to reduction of yield in the manufacture of light-emitting semiconductor devices due to failure of wiring, etc.

Figure 3:
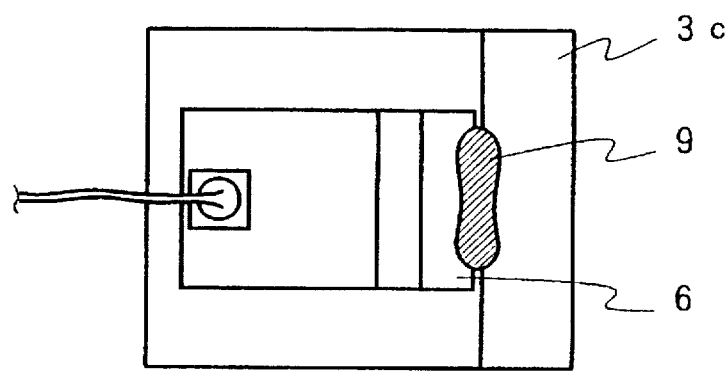
FIG. 3 is a view similar to FIG. 2 wherein a conductive resin is applied in a line form.

FIG. 3 shows another example of a light-emitting semiconductor device of the present invention. This example is structured similar to the above example except that the conductive material 9 is applied such that it extends along the gap between the end electrode 6 of the light-emitting chip 1 and the projecting portion 3c of the first electrode lead 3. The electrical connection by the conductive material 9 is performed by applying the Ag-particle contained paste resin in a straight-line form while moving a syringe contained therein with the pasty resin. The applied resin is thereafter cured. The electrically-conductive material thus provided will provide higher reliability of electrical connection.

Figure 4:
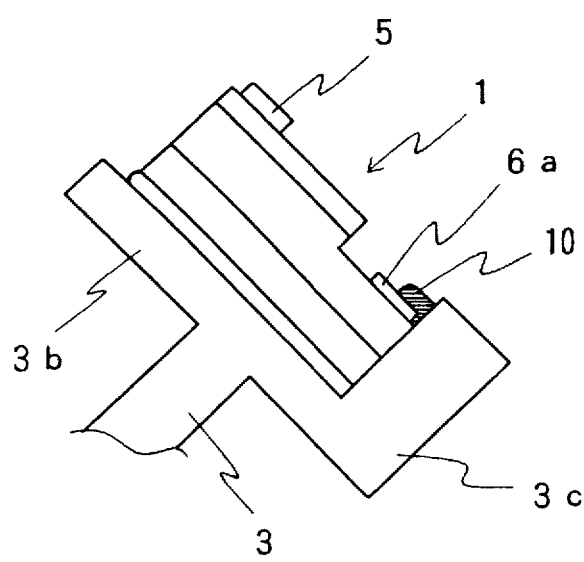
FIG. 4 is a side view similar to FIG. 1, showing that at a conductive resin is dripped with a first electrode lead inclined.

FIG. 4 shows another example of a light-emitting semiconductor device of the present invention. In this example, the top electrode of the light-emitting chip 1 is wire-bonded in a manner similar to the above example. However, the projecting portion 3c of the first electrode lead 3 is provided at a higher position relative to the end electrode 6a so that the conductive material is dripped onto between the end electrode 6a and the adjacent lateral wall of the projecting portion 3c instead of the top surface thereof. The dripping of the resin paste is done to one point, or preferably a plurality of points, between the light-emitting chip 1 and the projecting portion 3c, with the base portion 3b mounting with the chip 1 inclined for example by 30 degrees. With such a method, more positive connection is assured mechanically and electrically between the end electrode 6a and the projecting portion 3c. Alternatively, it is possible to apply the resin paste in a straight-line form by using a syringe or the like, instead of mere dipping. Incidentally, although in this example the end electrode is provided only on the top surface of the light-emitting chip, the same electrode may be formed to extend to the lateral surface of the chip.

Figure 5:
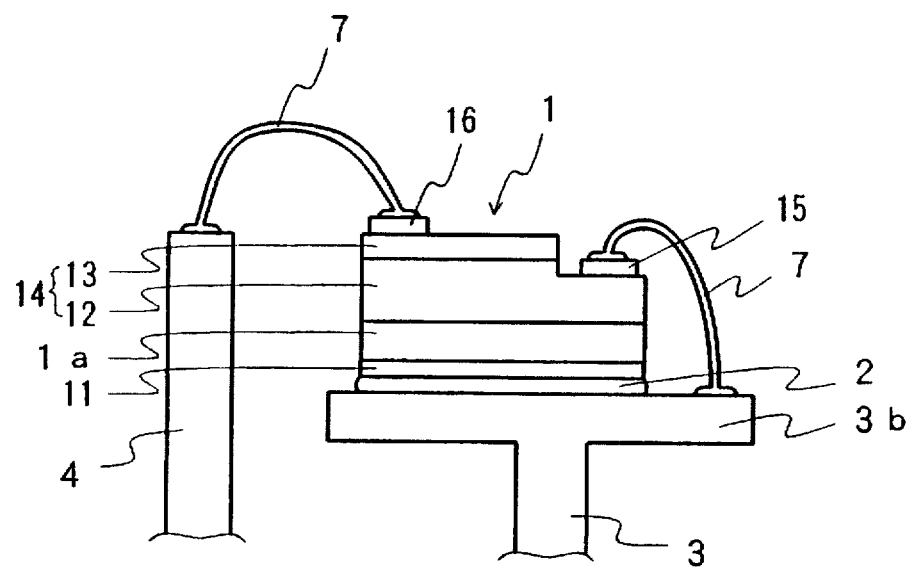
FIG. 5 is a side view of a light-emitting semiconductor device, showing an essential part thereof, according to second embodiment of the present invention.

FIG. 5 shows another embodiment of a light-emitting semiconductor device according to the present invention. In this embodiment, a light-reflecting film 11 is provided on the backside of the substrate 1a of the light-emitting chip 1 so that the light emitted from the light-emitting region toward the substrate 1a is reflected back to the front of the device, thereby enhancing the efficiency of light radiation. Incidentally, the FIG. 5 example has two wires respectively connected with the electrodes 15 and 16 of the light-emitting chip 1, as similar to the conventional structure. However, by applying the reflecting film 11 of this embodiment to the structures given in FIGS. 1 to 4, it is possible to provide effects in a combined form.

In the light-emitting semiconductor device, the reflection film 11 is formed on the backside of the LED chip 1, i.e., on the opposite surface of the substrate 1a to the semiconductor layer 14. The light-reflection film 11 is formed by sputtering metal oxide with optically high reflectivity involving magnesium oxide, titanium oxide, barium sulfate, and aluminum oxide. Alternatively, the reflection film 11 may be formed by depositing a highly-reflective metal such as aluminum or silver, or otherwise by applying and curing a silicone-resin paste containing a powder of the aforesaid metal oxide or ceramics.

The sputtering of metal oxide or ceramics not necessarily result in a mirror-finished surface, but offers a metallic white surface with high optical reflectivity. Consequently, with a sputtered reflecting film the light emitted toward the sapphire substrate 1a is almost completely reflected back toward the front of the device. To provide a metal oxide or ceramic reflection film, a sapphire wafer as a substrate, after or before forming an epitaxial semiconductor layer thereon, is placed upside down in a sputter apparatus to carry out sputtering a metal oxide or ceramics onto the backside of the wafer. Prior to sputtering, it is preferred to grind or lap the backside of the sapphire wafer to provide mirror finish for enhancing optical reflectivity. That is, where the backside of a wafer is roughened alike a frosted glass, even if a reflection film is provided on the backside of the wafer, the light emitted toward the backside will be scattered toward various directions by the rough surface. On the contrary, the reflecting film well combined with the mirror-finished back surface provides desired light reflection toward the front of the device. Moreover, if the thickness of the sapphire wafer is worked thin by grinding or the like, dicing or breaking will be facilitated.

The reflecting film can otherwise be provided by utilizing a siliconeresin paste, as stated before. That is, the aforesaid metal oxide or ceramics in powder is mixed in a silicone resin paste to be applied onto the backside of the wafer. By curing the paste, an optical reflecting film of the metal oxide or ceramics is provided. If die-bonding is made such that the cured reflecting film is almost completely covered by the die-bonding adhesive, the film will be properly protected against being peeled off from the backside of the substrate. And metal film such as Al or Ag for the reflecting film is provided by vacuum metallizing on to the backside of the wafer like aforementioned sputtering.

After providing the reflection film 11 on the backside of the wafer, the wafer is divided by breaking into individual LED chips. The LED chip 1 is then die-bonded onto the base 3b of the first electrode lead 3 through the use of an adhesive 2 such as Ag paste. Then, wire-bonding is done by Au wires 7 between the electrode 15 on the chip n-type layer 12 and the base 3b of the first lead 3 as well as between the electrode 16 on the chip p-type layer 13 and the tip of the second lead 4. After wire-bonding, the LED chip 1 is molded, together with the upper portions of the first and the second lead 3, 4, by a transparent resin, not shown, thereby providing a light-emitting semiconductor device.

Figure 6:
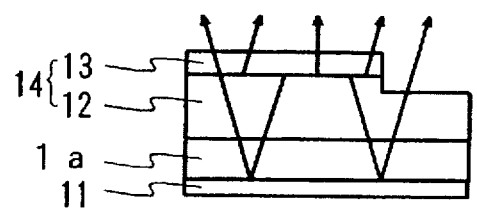
FIG. 6 is a side view of a light-emitting chip of FIG. 5 for explaining typically the direction of light traveling.
Figure 7:
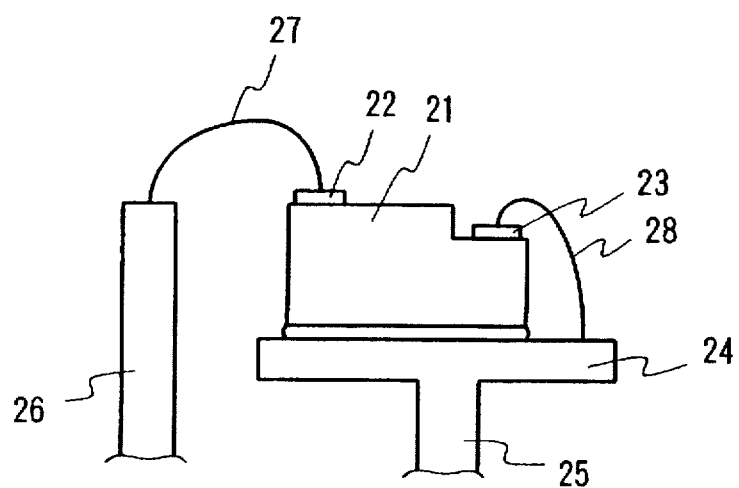
FIGS. 7(a) to 7(b) are respectively is a side view of a conventional light-emitting semiconductor device.
Figure 7:
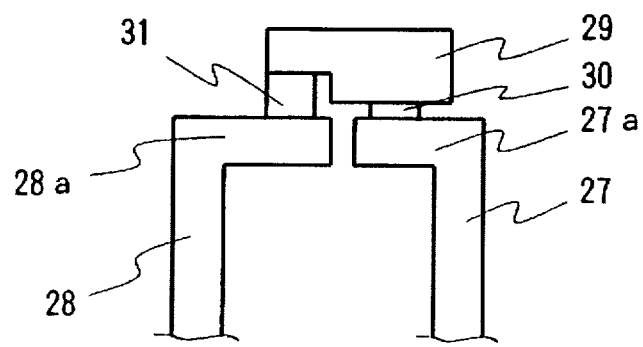

With the light-emitting semiconductor device of the present embodiment, the light emitted from the light-emitting region of the semiconductor layer 14 toward the substrate 1a is reflected by the reflection film 11 ahead of the device as shown by the arrows in FIG. 6, thereby intensifying the light radiation and hence raising the brightness. Thus, the efficiency of light radiation is enhanced.

Although, in the FIG. 5 example, wire-bonding is done similarly to the conventional structure wherein the electrode 15 on the n-type layer 12 side is wire-bonded to the first electrode 3, if an end electrode is utilized instead of the electrode 15, failures due to wire-bonding are greatly reduced with the reliability of electrical connection raised.

As for the light-emitting chip, explanations were made in the above examples on the chips of a p-n junction structure where a p-n junction as a light-emitting layer serves for recombination of carriers for emission of light. However, it is needless to say that the electrode and/or the light-reflection film of the present invention can be likewise applied to a structure employing so-called a double-hetero junction structure where a light-emitting chip has an active layer as a light-emitting region sandwiched between an n-type layer and a p-type layer.

Furthermore, in the above examples, the light-emitting chip was based on GaN wherein gallium-nitride based compound semiconductor layers are epitaxially grown on a sapphire substrate for emission of blue-colored light etc. However, the present invention is not limited to such material or application.

Although the invention has been illustrated and described in what is conceived to be the most practical and preferred embodiment, it is recognized that departures may be made therefrom within the scope of the invention, but are to be accorded the full scope of the claims so as to embrace any and all equivalent devices, apparatus, functions, and method.

As described in detail above, a light-emitting semiconductor device of the present invention has electrical connection between the end electrode and the projecting portion through an electrically-conductive resin. Therefore, implementation of electrical connection with using a conductor wire is limited to one of the chip electrodes because the other electrode is directly connected through conductive resin to the projecting portion integral with the chip-mounting base portion. Consequently, wire-bonding failure during the fabrication process is greatly reduced by a simplified process, to thereby improve yield of manufacture. The completed device is highly reliable in electrical connection. Furthermore, even if force be applied through an electrode lead, the light-emitting chip is almost free from stresses.

Where the projecting portion is formed to have a top surface substantially in flush with a top face of the end electrode of the light-emitting chip, conductive resin may be dripped onto between them, providing reliable connection. On the other hand, where the projecting portion has a top surface higher than a top face of the end electrode of the light-emitting chip, conductive resin may be dripped onto between them with the first electrode lead inclined, further enhancing the reliability of connection.

Furthermore, If a light-reflecting film is provided on the backside of a light-emitting chip, the light emitted from the light-emitting layer and traveling toward the substrate is reflected back to the front of the device, being effectively utilized. To this end, the eficiency of light radiation is improved to provide increased brihtness, particularly of blue-color light.

Although preferred embodiments have been described in some detail, it is to be understood that certain changes can be made by those skilled in the art without departing from the spirit and scope of the invention as defined by the appended claims.

What is claimed is:

1. A light-emitting semiconductor device comprising:

a light-emitting chip having an insulator substrate and semiconductor layers made of gallium-nitride base compound semiconductor overlying said substrate, said semiconductor layers having first and second conductivity type layers, and said second conductivity type layer having an exposed surface formed by removing part of said semiconductor layers;

a top electrode formed on a surface of said first conductivity type layer;

an end electrode formed on an exposed surface of said second conductivity type layer at an end portion thereof;

a first electrode lead mounted with said light-emitting chip;

a second electrode lead extending near said first electrode lead;

a conductor wire electrically connected between said second electrode lead and said top electrode; and wherein said end electrode and said first electrode lead are electrically connected through an electrically-conductive paste material.

2. The light-emitting semiconductor device of claim 1, wherein said first electrode lead having a base portion mounted with said light-emitting chip and having a projecting portion extending from said base portion and extending along an adjacent surface of said light-emitting chip, and said projecting portion being formed such that a top face thereof is substantially in flush with that of said end electrode of said light-emitting chip.

3. The light-emitting semiconductor device of claim 1, wherein said first electrode lead having a base portion mounted with said light-emitting chip and having a projecting portion extending from said base portion and extending along an adjacent surface of said light-emitting chip, and said projecting portion being formed such that a top face thereof is higher than that of said end electrode of said light-emitting chip so that electrical connection is done between said end electrode and a lateral surface of said projecting portion.

4. The light-emitting semiconductor device of claim 1, wherein said substrate of said light-emitting chip is formed of a material for transmission of light emitted from said semiconductor layer and said light-emitting chip has a light-reflecting film formed on a surface being mounted to said first electrode lead.

5. The light-emitting semiconductor device of claim 4, wherein said light-reflecting film is a metal oxide film or a ceramic film formed on a backside of said substrate.

6. The light-emitting semiconductor device of claim 1, wherein said substrate is formed of sapphire.

7. The light-emitting semiconductor device of claim 1, wherein said electrically-conductive paste material is a cured Ag-particle contained paste material.

* * * * *